(12) United States Patent
Kim et al.

(10) Patent No.: US 8,334,539 B2
(45) Date of Patent: Dec. 18, 2012

(54) MANUFACTURING METHOD FOR CONTACT PADS OF A THIN FILM TRANSISTOR ARRAY PANEL, AND A THIN FILM TRANSISTOR ARRAY PANEL HAVING SUCH CONTACT PADS

(75) Inventors: Dong-Gyu Kim, Yongin-si (KR); Yeong-Keun Kwon, Suwon-si (KR); Ju-Hee Lee, Cheonan-si (KR)

(73) Assignee: Samsung Display Co., Ltd. (KR)

( * ) Notice: Subject to any disclaimer, the term of this patent is extended or adjusted under 35 U.S.C. 154(b) by 406 days.

(21) Appl. No.: 12/512,623

(22) Filed: Jul. 30, 2009

(65) Prior Publication Data

US 2010/0258820 A1    Oct. 14, 2010

(30) Foreign Application Priority Data

Apr. 9, 2009    (KR) .................. 10-2009-0030998

(51) Int. Cl.
    *H01L 33/00*    (2010.01)
(52) U.S. Cl. ........ 257/72; 257/E33.06; 438/34; 349/113
(58) Field of Classification Search ............... 257/72, 257/E33.06; 438/34; 349/113
    See application file for complete search history.

(56) References Cited

U.S. PATENT DOCUMENTS

| | | | | |
|---|---|---|---|---|
| 6,624,446 | B2 * | 9/2003 | Kim | 257/72 |
| 7,023,508 | B2 * | 4/2006 | You | 349/113 |
| 7,528,909 | B2 * | 5/2009 | Ahn et al. | 349/114 |

FOREIGN PATENT DOCUMENTS

| | | |
|---|---|---|
| JP | 3951033 | 8/2007 |
| KR | 10-0258719 | 3/2000 |
| KR | 10-2005-0020708 | 3/2005 |
| KR | 10-2005-0070446 | 7/2005 |
| KR | 10-0560975 | 3/2006 |
| KR | 10-0715943 | 5/2007 |
| KR | 10-0724742 | 5/2007 |
| KR | 10-0779946 | 11/2007 |
| KR | 10-2008-0054629 | 6/2008 |
| KR | 10-2008-0080740 | 9/2008 |

* cited by examiner

*Primary Examiner* — Steven J Fulk
(74) *Attorney, Agent, or Firm* — Innovation Counsel LLP

(57) ABSTRACT

A thin film transistor array panel includes a first insulation substrate, a plurality of data wires formed on the first insulation substrate and extending in a first direction, a data pad region formed on the first insulation substrate and having plural ones of the data wires extending therefrom, and an organic layer formed on the data wires, where the organic layer has a greater thickness where it is disposed over the data wires than the thickness it has between the data wires. The surface of the organic layer of the data pad region includes minute slit patterns that extend parallel to the first direction of the data wires, and the data wires have line boundaries of a zigzag shape.

20 Claims, 7 Drawing Sheets

MANUFACTURING METHOD FOR CONTACT PADS OF A THIN FILM TRANSISTOR ARRAY PANEL, AND A THIN FILM TRANSISTOR ARRAY PANEL HAVING SUCH CONTACT PADS

CROSS-REFERENCE TO RELATED APPLICATION

This application claims priority to and the benefit of Korean Patent Application No. 10-2009-0030998 filed in the Korean Intellectual Property Office on Apr. 9, 2009, the entire contents of which application are incorporated herein by reference.

BACKGROUND (a) Field of Disclosure

The present description relates generally to a thin film transistor array panel such as used in flat panel displays and to a mass production manufacturing method of a thin film transistor array panel. More particularly, the present description relates to a thin film transistor array panel and a manufacturing method of a thin film transistor array panel to reduce breakage of data line metal due to corrosion caused by receiving a corrosive attack because of stripping away of an organic layer and an insulating layer to thereby expose a data contact pad. Also, the disclosure relates to formation of the data contact pad so that it can be easily contacted with.

(b) Description of Related Technology

A liquid crystal display (LCD) is one type of flat panel display that is now widely used. The typical liquid crystal display includes two display panels in which field generating electrodes such as pixel electrodes and a common electrode are formed, and a liquid crystal layer is interposed between the display panels. The pixel-electrodes are often formed of a transparent conductive material such as ITO. A voltage is applied to the field generating electrodes to thereby generate an electric field extending into or through the liquid crystal layer, which field then determines the direction of liquid crystal molecules of the liquid crystal layer, and an image is displayed by controlling the polarization of incident light or of backlight provided light.

The two display panels of the liquid crystal display include a thin film transistor (TFT) array panel formed with various signal lines, thin film transistors, and pixel electrodes, and a common electrode panel formed with a common electrode.

The thin film transistor (TFT) array panel includes signal lines such as gate wires and data wires, and also has transparent pixel electrodes formed thereon (e.g., made of ITO). The signal lines extend to edge connection pads where the latter are disposed in peripheral non-display areas of the TFT array panel and where the edge connection pads are used for connection with external circuitry such as with gate line driver ICs and data line driver ICs. An insulating layer is formed between the signal lines and pixel electrode regions for defining sufficient insulation therebetween.

The insulating layer is generally made of a silicon nitride (SiNx), and is deposited on the signal lines through chemical vapor deposition (CVD). If the signal lines are disposed too close to the pixel electrodes, excessive crosstalk may be generated, and this crosstalk may be due to the silicon nitride between the signal lines and the pixel electrodes being too thin and thus tending to function as a signal coupling dielectric material such that an excessively large capacitance is formed therebetween.

To reduce or prevent the crosstalk, the thickness of the silicon nitride (the distance between the signal line and the pixel electrode) is often supplemented substantially to thereby decrease the capacitance. However it is not easy to thicken the insulation by depositing more the silicon nitride with a desired thickness through chemical vapor deposition because it takes a long time. Accordingly, to solve this problem, a method in which an organic layer is thickly coated on the signal lines through a coating method has been proposed.

When the gate wire, the gate insulating layer, an active layer, the data wire, and a data insulating layer are formed, and the organic layer is formed on the data insulating layer in the thin film transistor array panel. If the thickness of the organic layer at the contact pad portions of the TFT panel is relatively large; and thus the contact pads are recessed deep under the top of the organic layer due to increased thickness of the organic layer, then conductive balls or other like means that are used for resiliently contacting with the pad and thereby connecting it with external circuits such as ICs are pushed up relative to the recessed contact pads such that increased contact resistance may occur between the external circuit and the pad, and as a result, a signal transfer deterioration may develop. In one embodiment, the conductive contact-making balls are provided on a flexible thin film ribbon connector which is used during manufacture to connect the TFT array panel with external circuitry. Particularly, when the external circuitry uses multiple channel ICs such as with 960 data lines present in the panel, the pitch between the contact pads may be as small as 37 μm such that the width of the SD pad metal (side of display contact metal) is only 20 μm after etching, and if the width of the exposure opening through the organic layer is less than the width of the opening in the SD pad portion, given possibility of a misalignment overlay, then the contact openings through the organic layer at the contact pad locations may be only about 11 μm each, and thereby the above-described deterioration of contact may be often present.

Accordingly, to prevent or reduce this, a means should be devised where the effective thickness of the organic layer in the pad contact portion of the panel is less than the thickness of the organic layer in the display area of the panel.

One exemplary method disclosed herein for reducing the effective thickness of the organic layer in the pad contact portion of the panel relies on forming the organic layer from a composition that defines a negative photosensitive film (Nega-PR). Then a photolithography mask is defined with etch control gratings so that some portions of the Nega-PR receive a greater amount of light and are thus correspondingly not etched away while other portions that do not receive much light are correspondingly etched away to a greater degree. In one embodiment, the photomask for the Nega-PR organic layer has wave-like ripples or slit patterns formed therein in the areas corresponding to the pad contact portions of the panel where the slits are formed with a Cr metal pattern and each on-photomask slit piece has a line width of less than the resolution of a light exposer such that patterning light is transmitted through the photomask and to the Nega-PR organic layer with varying degrees of intensity and thus the resulting post-etch height of the organic layer can be selectively controlled so as the proved reduced effective thickness in the region of the contact pads.

In conventional art, the photomask slits extend perpendicularly relative to the data lines extending from the contact pads and the organic layer is a Positive-PR type. The reason for this is to avoid misalignment problems. If instead, the direction of the slits had been formed parallel to the direction of the data wires, then if the substrate and the mask for the organic layer are mis-aligned, problems will ensue at the end of the data wire that is to be exposed for defining a contact area (by etching away of the organic layer at that spot) and which should thus have a corresponding opening in the Cr metal directly over it for causing substantial etching under the normal condition of using the positive photosensitive organic layer (Posi-PR). However if there is misalignment that pad contact area will instead lie partly under a dark portion of the Cr metal such that the post-etch thickness of the organic layer is increased by the lowered exposure amount. As a result, the to-be-exposed end section of the data wire may not be properly exposed. Elsewhere, the misalignment will cause too little of a thickness of the organic layer to remain and this will reduce protection against attack by corrosive chemicals and against consequential deterioration of data line integrity.

After patterning the organic layer by using the mask including the slits with the direction being conventionally perpendicular to the data wires, the data insulating layer is etched by using the patterned organic layer as an etch mask to form wells or depressions at portions of the panel where pixel electrodes will be formed and also at portions of the panel where the pad contacts will be formed.

As described above, the contact resistance between the external circuits and the pad contact portions may be disadvantageously increased due to misalignment caused increase in the thickness of the organic layer such that the signal transmitting deterioration may be generated, and conversely, when the organic layer is thin in other places, the data wires may undesirably receive more attack by corrosive chemicals and thereby disconnection due to wire corrosion may be generated. It is to be understood that some of the above description may not be part of the prior art and thus it should not be treated as an admission regarding what is prior art.

SUMMARY

The present disclosure provides solutions that solve both of these two problems, namely, undesirably having too much organic layer material left behind around the contact pad portions of the TFT array panel and undesirably having too little organic layer material left behind around the data line extension areas of the TFT array panel.

A thin film transistor array panel according to an exemplary embodiment is mass produced by forming a plurality of gate wires on a substrate and gate metal islands at locations where contact pads are to be formed, forming a gate insulating layer over the gate wires, forming an active layer including active layer islands or peninsulas where the contact pads are to be formed, forming a plurality of data wires over the active layer, forming a data insulating layer over the data wires, depositing a negative photosensitive organic layer (Nega-PR) on the data insulating layer and photolithographically patterning the organic layer. In one embodiment, a photomask used for exposing the negative photosensitive organic layer has a slit pattern of Cr metal that is formed with a line width of less than the resolution of a light exposer and parallel to a direction of the data wires (when the photomask is aligned for exposing the organic layer), and the slits disposed for patterning the organic layer on the data wires transmit more light than the slits disposed for patterning the organic layer between the data wires. In one embodiment, the resulting reduced thickness of organic layer material between the data wires is continued into regions between the contact pads so that contact pins that are to engage with the contact pads are not obstructed from doing so by the thicker regions of the organic layer.

In order to provide for different thicknesses of the Nega-PR organic layer in different regions of the array panel, the corresponding photomask is structured so that a first ratio of a slit opening width to a dark area of Cr metal width of the mask is larger than a second ratio of slit opening width to the dark area of Cr metal width where the second ratio occurs for a portion of the mask corresponding to areas disposed between the data wires and the first ratio occurs for a portion of the mask corresponding to areas situated over the data wires.

Here, the Cr dark area indicates the portion where the Cr metal is disposed on the mask, and the Cr opening indicates the portion where the Cr metal pattern is not disposed on the mask.

In this way, when exposing the negative photosensitive organic layer (Nega-PR), in the case that the slits are formed parallel to the extension direction of the data wires, the organic layer slits on the data wire of the data pad region are formed to allow more light to transmit than the slits of the interval between the data wires of the data pad region, as described above, when the data wire of the substrate and the mask for an organic layer are mis-aligned under the exposure of the organic layer, the edge of the data wires to be exposed corresponding to the Cr metal opening of the mask slits under the normal alignment is exposed corresponding to the dark area of the Cr metal such that the thickness of the organic layer is further lower by the small exposure amount, and thereby the attack deterioration of the data wire may be worsen.

To prevent the deterioration problem, when considering the expected process deviation for mass production in which the alignment of the data wire of the substrate and the photomask for the organic layer is twisted at an angle, the boundary line of the data wire of the data pad is designed to have a zigzag shape such that the total edge portion of the data wire does not correspond to the dark area of the slit, and a portion of the edge of the data wire corresponds to the opening of the slits to be exposed although mis-alignment is happened.

In an exemplary embodiment, a photomask for exposure of a negative photosensitive organic layer (Nega-PR) has a slit pattern of Cr metal having a line width of less than the resolution of a light exposer and stretched in a direction parallel to the data wires, the slits of the data wire of the data pad region are formed to allow more light to transmit than the slits between the pads of the data pad region, and the boundary line of the data wire of the data pad region has a zigzag shape. Accordingly, the organic layer disposed on the data wires is formed to be thicker than the organic layer disposed between the data wires. Therefore, the data wires are protected by the thicker portions of the organic layer and the organic layer portions between the wirings remain thin, thereby allowing contact fingers to more easily enter end-regions of the data wires where contact pads are formed, where the easier entry helps to minimize contact resistance and thus improve connection with an external circuit film.

DETAILED DESCRIPTION

Figure 1:
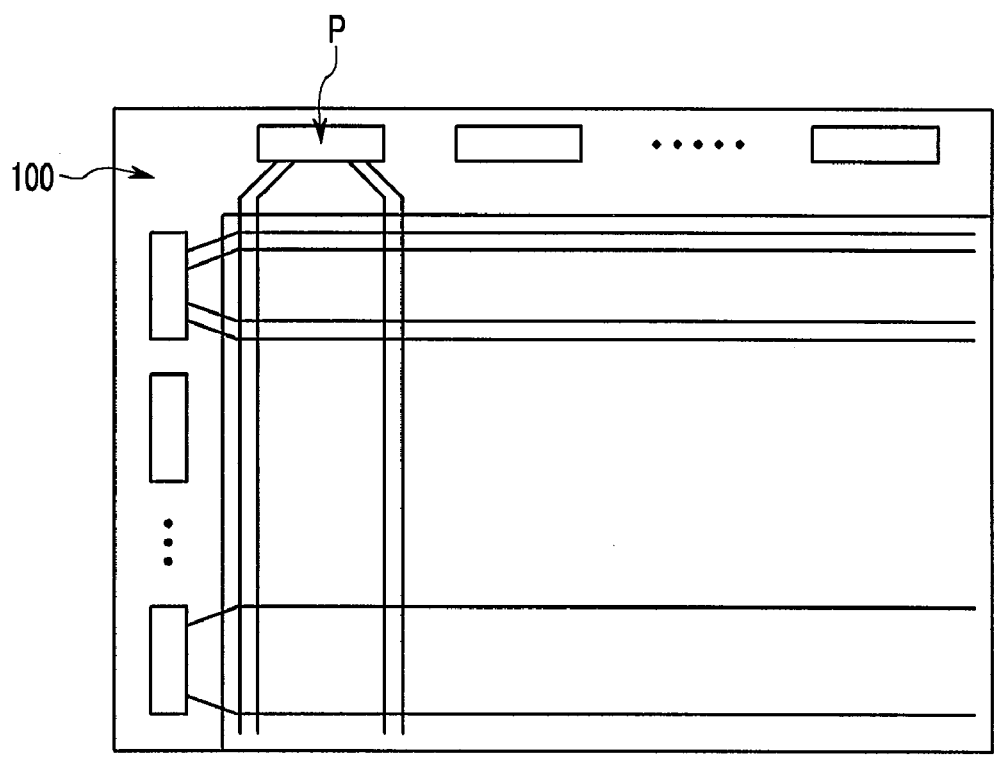
FIG. 1 is a layout view of a thin film transistor array panel of a liquid crystal display.

In the following detailed description, only certain exemplary embodiments of in accordance with the present disclosure have been shown and described, simply by way of illustration. As those skilled in the art would realize, the described embodiments may be modified in various different ways, all without departing from the spirit or scope of the present disclosure. Accordingly, the drawings and description are to be regarded as illustrative in nature and not restrictive, and like reference numerals designate like elements throughout the specification. Detailed descriptions of well-known techniques are omitted.

In the drawings, the thickness of layers, films, panels, regions, etc., are exaggerated for clarity. It will be understood that when an element such as a layer, film, region, or substrate is referred to as being "on" another element, it can be directly on the other element or intervening elements may also be present. On the other hand, when an element is referred to as being "directly on" another element, there are no intervening elements present. Further, it will be understood that when an element such as a layer, film, region, or substrate is referred to as being "under" another element, it can be directly under the other element or intervening elements may also be present. On the other hand, when an element is referred to as being "directly under" another element, there are no intervening elements present.

Now, a thin film transistor array panel according to an exemplary embodiment will be described with reference to FIG. 1 to FIG. 6.

Figure 2:
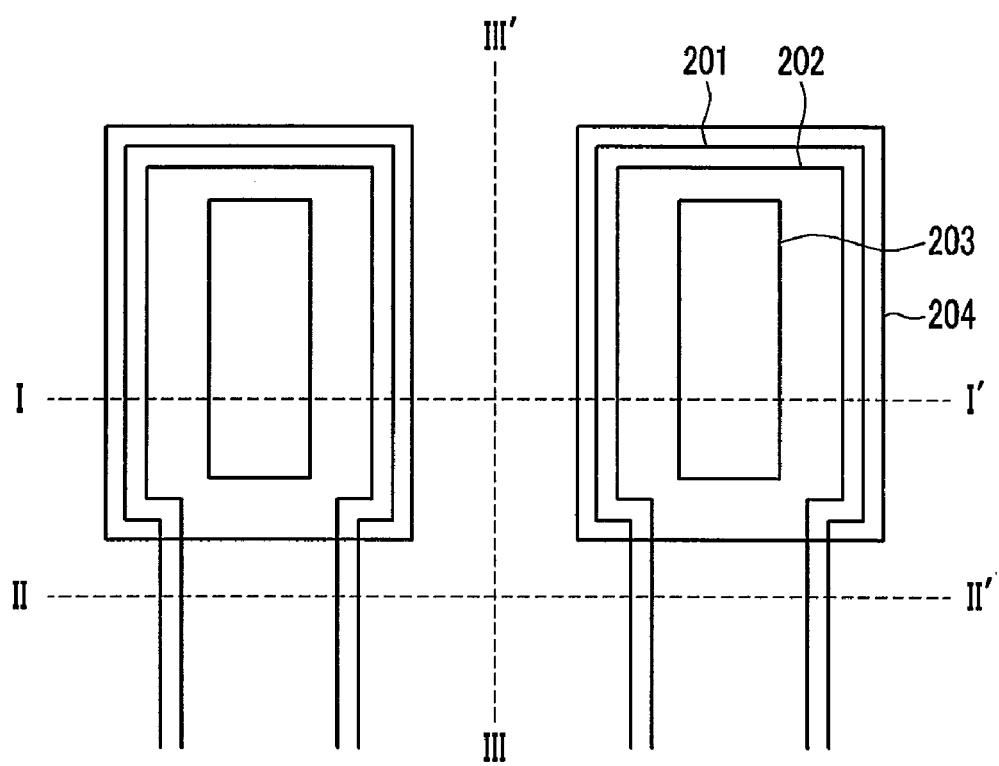
FIG. 2 is an enlarged layout view of a P region of FIG. 1 that engages with contact pins or the like, FIG. 3 is a cross-sectional view taken along the line I-I' of FIG. 2.
Figure 3:
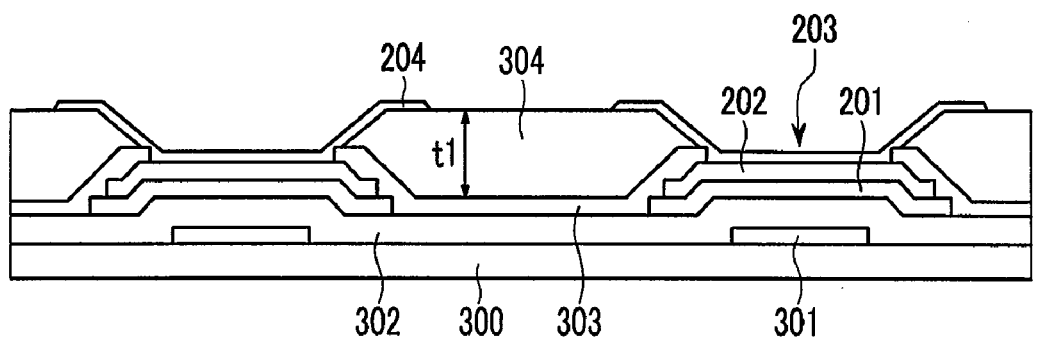
Figure 4:
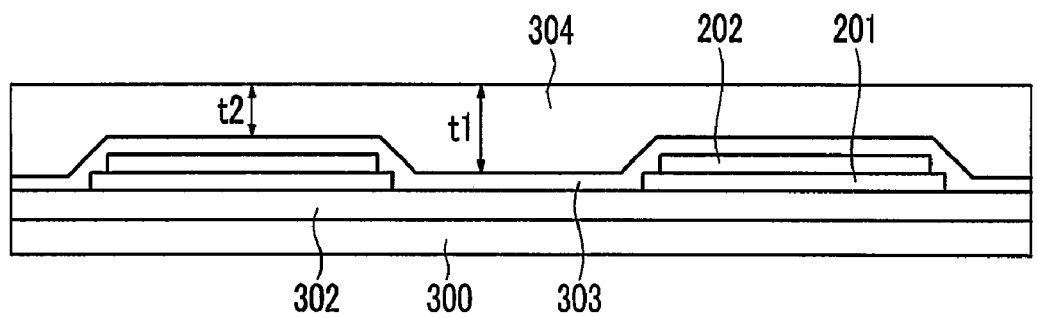
FIG. 4 is a cross-sectional view taken along the line II-II' of FIG. 2.
Figure 5:
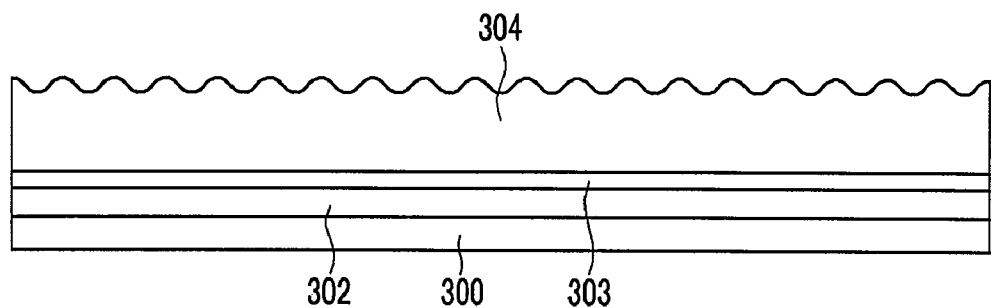
FIG. 5 is a cross-sectional view taken along the line III-III' of FIG. 2.

FIG. 1 is a layout view of a thin film transistor array panel 100 of a liquid crystal display, FIG. 2 is an enlarged layout view of a contact pads-including P region of FIG. 1, FIG. 3 is a cross-sectional view taken along the line I-I' of FIG. 2, FIG. 4 is a cross-sectional view taken along the line II-II' of FIG. 2, and FIG. 5 is a cross-sectional view taken along the line III-III' of FIG. 2.

FIG. 2 shows a data coupling connection pad which may be connected to by contact with resiliently urged contact balls at ends of resilient contact fingers or otherwise to an external circuit such as to a data-supplying IC which supplies data signals to the TFT array panel 100, where a manufacturing method for the panel 100 is described as follows.

As shown in FIG. 3, firstly, an island pattern 301 of a gate layer metal is formed on a substrate such that the height of a later-formed, pad contact portion 204 will be raised to provided better contacting with an external circuit or circuit film where the rise is provided in part by presence there of the island 301 of the gate layer metal. Next, a gate insulating layer 302 is formed (e.g., of a silicon oxide or a silicon nitride) and an active semiconductive material layer 201 (e.g., heavily doped to be conductive) and an overlying data wire of a data metal 202 are patterned. Here, the pitch between the data wires 202 may be less than 40 μm, and the width of openings 203 defined in the organic layer (which organic layer 304 is described shortly) may be less than 15 μm.

Next, a data-lines insulating layer 303 made of an inorganic insulating layer such as a silicon nitride (SiNx) is deposited to protect the data wires. A negative photosensitive organic layer (Nega-PR) is coated over the structure, exposed via a photomask that will be described below, and the exposed Nega-PR layer is developed to form the organic layer pattern 304 as shown schematically in FIGS. 1-4.

Elsewhere on the panel, as shown in FIG. 4, the organic layer 304 has the characteristic to have a flat top surface such that the thickness t2 of the organic layer disposed on the data wire made of the data metal and the active layer is thinner than the thickness t1 of the organic layer on the portion where the data wire does not exist.

As shown in FIG. 5 (section III-III' of FIG. 2), a grating or slit pattern is provided on the photomask used for forming the organic layer and light is projected through the slit pattern to the organic layer 304 such that minute waves or slit pattern ripples form on the top major surface of layer 304 and are stretched in a direction perpendicular to the longitudinal axes of the data wires, where the waves or ripples are formed on the surface of the organic layer 304 prior to selective etching of the organic layer 304.

Figure 6:
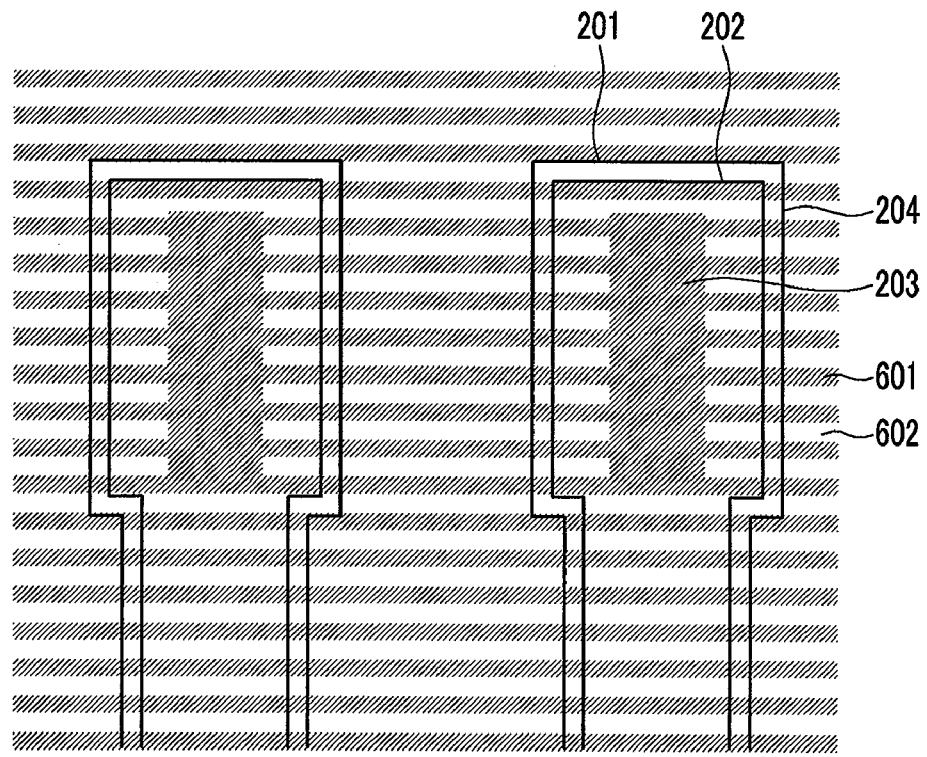
FIG. 6 is a view showing alignment of a substrate including a gate wire, a gate insulating layer, an active layer, a data wire, and a data insulating layer and a mask for exposure of the organic layer.

FIG. 6 is a view showing alignment of a substrate including a gate wire, a gate insulating layer, an active layer, a data wire, and a data insulating layer and a mask for an organic layer for exposure of the organic layer.

Here, the hatched dark portions 601 represent the slit pattern lines which are made of a Cr metal formed on the mask used for photolithographically patterning the organic layer and where the slit-forming lines each have a line width less than the resolution (fraction of wavelength) of the light used by the corresponding light exposer apparatus (e.g., the stepper). The slit pattern is formed to extend in the direction perpendicular to the data wires. Also here, white portions 602 represent the slit gaps left open between the slit lines.

After using the photomask and its slit patterns to form the patterned organic layer, the data insulating layer 303 is etched by using the patterned organic layer as an etch mask to form a contact exposure hole such as 203 to expose the underling data wire material and to simultaneously create pixel electrode wells situated elsewhere on the panel 100.

Next, a pixel electrode metal layer 204 is deposited and patterned such that in the contact areas, the pixel electrode metal 204 and the data wire metal 204 are connected to each other through the contact holes previously formed through the data insulating layer and the organic layer. In the pixel electrode wells (not shown), the pixel electrode metal 204 deposits as part of the formation of respective display pixels.

Next, a thin film transistor array panel according to another exemplary embodiment will be described with reference to FIG. 7 to FIG. 9.

A formation sequence of a data pad region according to the second exemplary embodiment is substantially the same as the formation sequence of the above-described first embodiment except that the shape of the data wire and a process of forming the organic layer surface waves pattern according to the second exemplary embodiment are different.

Figure 7:
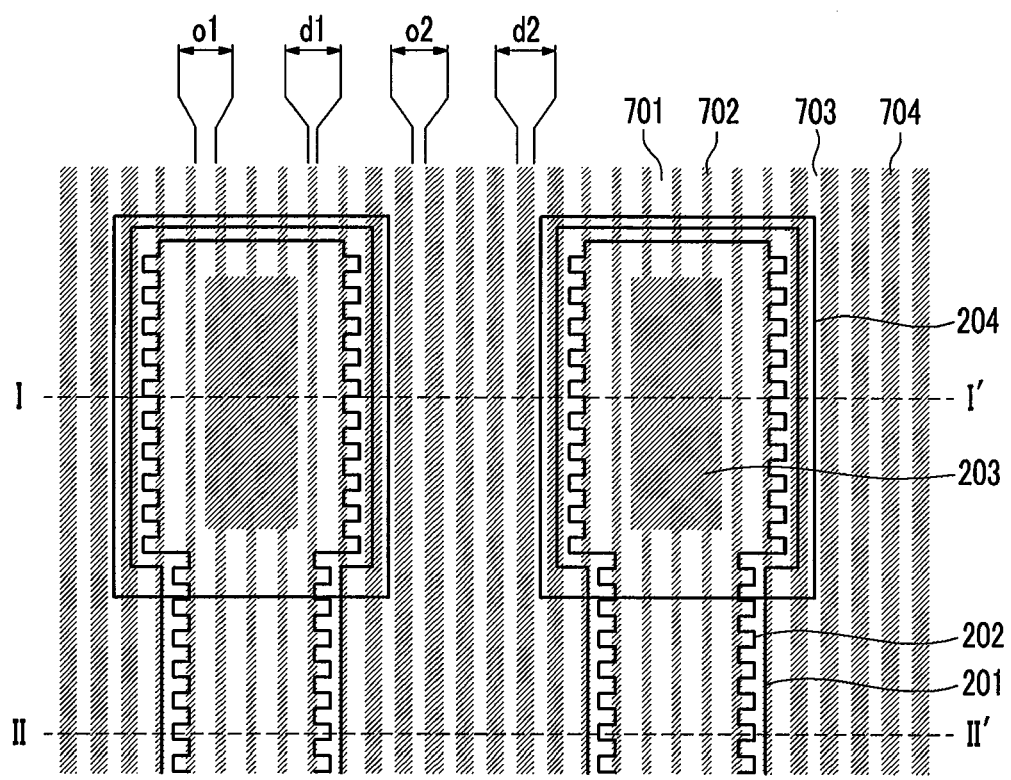
FIG. 7 is a view showing alignment of a substrate including a gate wire, a gate insulating layer, an active layer, a data wire, and a data insulating layer and a mask for exposure of the organic layer in an exemplary embodiment.

FIG. 7 is a top planar view showing alignment of a substrate including some not illustrated elements such as gate wires, a gate insulating layer, an active layer, and also illustrated elements such as data wires, and an inorganic data insulating layer and a photomask used for patterning an organic layer so that the Nega-PR organic layer of the second exemplary embodiment is selectively etched to different depths based on how thick of thin the photomask slit lines are.

When forming a data wire 202 of a data pad, the boundary line of the data wire 202 is patterned with a zigzag shape so that inadvertent deterioration of one edge (due to mask misalignment) is countered by strengthening of the opposed line edge of the data wire. Next, a data insulating layer 303 made of an inorganic insulating layer such as SiNx is deposited.

Next, when a negative photosensitive organic layer (Nega-PR) is coated on the data insulating layer and exposed and developed to form a patterned organic layer 304 through a photolithography process. In this embodiment, the photomask used for patterning the organic layer in the data pads region (P) has a slit pattern made of relatively thin Cr metal lines whose line width are less than the resolution of the light exposer and which lines extend in the direction parallel to the data wire. The slit gaps of the photomask over the region (e.g., of the data wire and around the region of the data contact pad are wider than in other places so that more light will pass through the wider slit gaps and thus more organic layer material will be left behind for example over the data wires where they extend below the data pad region 204.

For this, as shown in FIG. 7, the opening width to dark line width ratio (o1/d1) in the regions over the data wires where they extend below the data pad region 204 are relatively large so as to thereby leave behind an ample thickness (t4 of FIG. 9) of organic protective material over the data lines there. By contrast, the opening width to dark line width ratio (o2/d2) of the area between the data contact pads is substantially smaller so as to thereby leave behind a correspondingly smaller thickness (t3 of FIG. 8) of organic material between the contact recesses 203 and thereby avoid or mitigate the ball contact ejecting problem described above. At the same time the more ample thickness (t4 of FIG. 9) of organic protective material over the data lines better protects those lines from attack by corrosive chemicals and thus avoids or mitigates the line breakage problem described above.

While the condition of o1/d1 being larger than o2/d2 is satisfied, the specific values of dimensions d1, d2, o1, and o2 may be variously changed as deemed appropriate for specific implementations.

When the dark line width d1 of the Cr metal disposed on the data wire is fixed to be the same as the dark line width d2 of the Cr metal disposed between the data wires, the opening width o1 the Cr metal disposed on the data wire may be larger than the opening width o2 the Cr metal disposed between the data wires. When the opening width o1 the Cr metal disposed on the data wire is fixed to be the same as the opening width o2 of the Cr metal disposed between the wirings data wire, the dark line width d1 of the Cr metal disposed on the data wire may be less than the dark line width d2 of the Cr metal disposed between the data wires.

Also, all of d1, d2, o1, and o2 may have different values.

Here, the dark areas 702, 704 indicate the portion where the Cr metal is disposed on the mask, and the openings 701, 703 indicate the portion where the Cr metal is not disposed.

Here, the pitch between the data wires may be less than 40 μm and the width of the opening 203 of the organic layer may be less than 15 μm.

Figure 8:
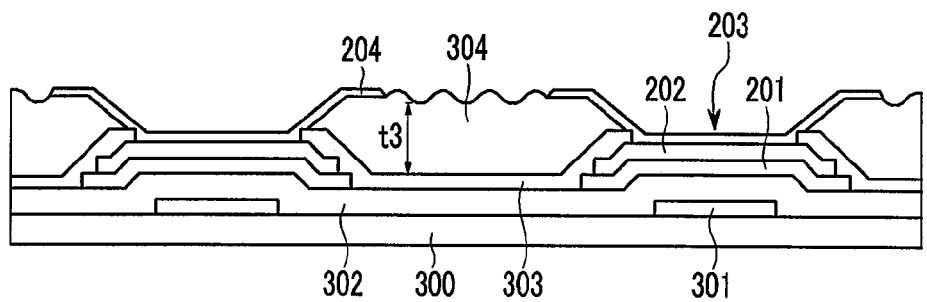
FIG. 8 is a cross-sectional view taken along the line I-I' of FIG. 7 according to an exemplary embodiment.
Figure 9:
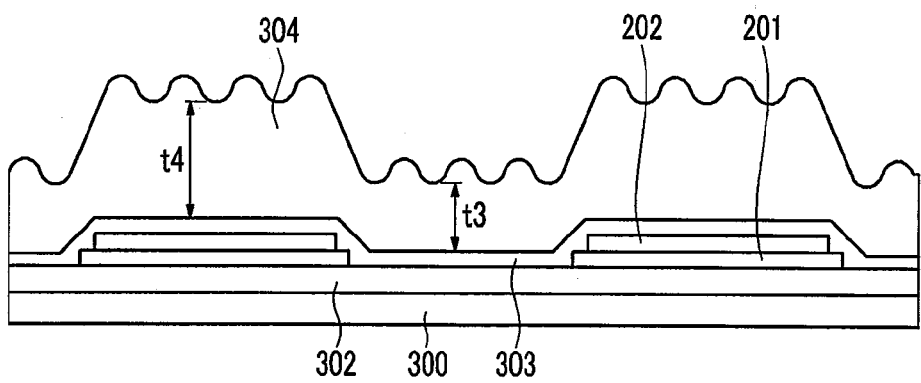
FIG. 9 is a cross-sectional view taken along the line II-II' of FIG. 7.

FIG. 8 is a cross-sectional view taken along the line I-I' of FIG. 7 according to an exemplary embodiment of the present invention, and FIG. 9 is a cross-sectional view taken along the line II-II' of FIG. 7.

As shown in FIG. 9, the thickness t4 of the organic layer of the region on the data wire is thicker than the thickness t3 of the organic layer of the region between the data wires.

Also, as shown in FIG. 8 and FIG. 9, the slit pattern of the mask for an organic layer is projected on the organic layer such that the minute slit pattern with the direction parallel to the data wire is formed on the surface of the organic layer.

Figure 10:
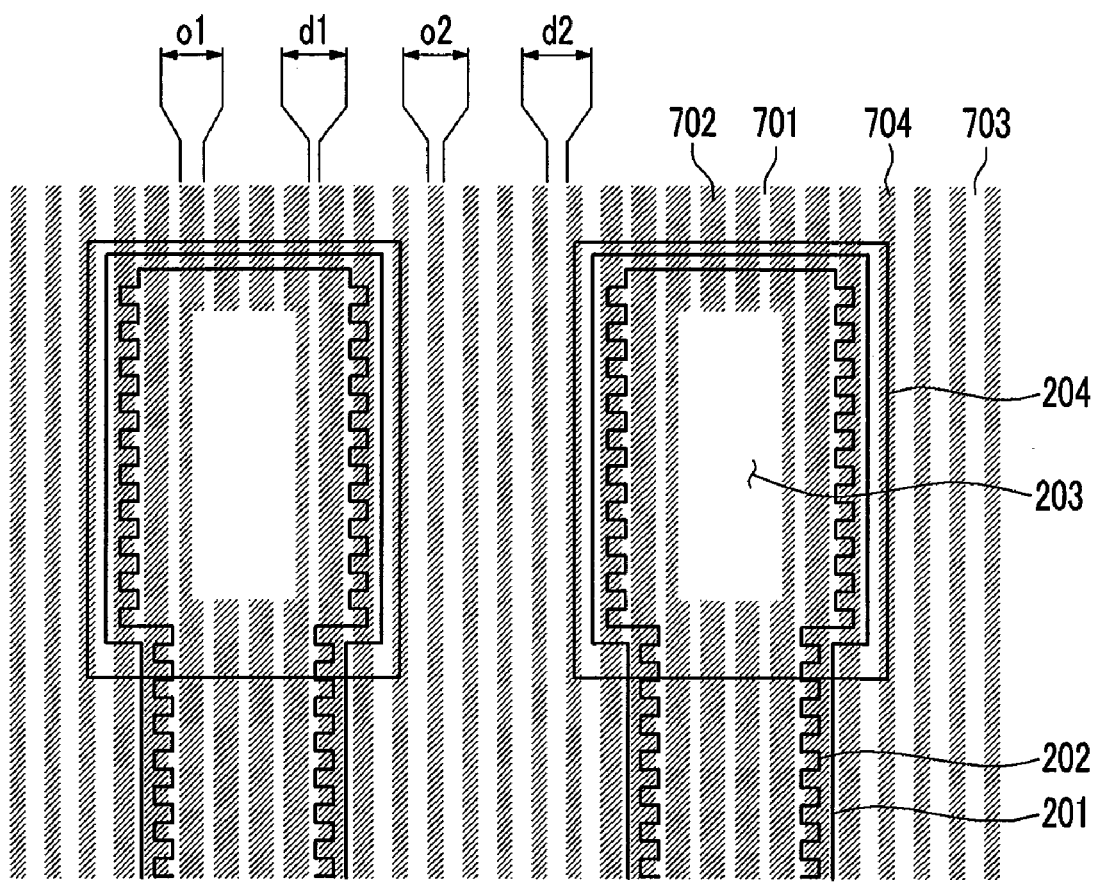
FIG. 10 is a view of a mask for exposure of an organic layer according to the second exemplary embodiment.

FIG. 10 is a view of a mask for an organic layer according to a third exemplary embodiment.

In the third exemplary embodiment, a positive photosensitive organic layer (Posi-PR) is formed on the data insulating layer. As to the positive photosensitive organic layer, a portion receiving the light is maintained, and a portion that does not receive the light is removed. Accordingly, contrary to the negative photosensitivity (Nega-PR) organic layer of FIG. 9, the ratio (o1/d1) of the opening width o1 of the Cr metal with respect to the dark line width d1 of the Cr metal disposed on the data line is set to be less than the ratio (o2/d2) of the opening width o2 of the Cr metal with respect to the dark line width d2 of the Cr metal disposed between the data wires.

In the third exemplary embodiment, the cross-sectional view taken along the line II-II' of FIG. 2 is the same as FIG. 9.

While teachings have been provided in connection with what is presently considered to be practical exemplary embodiments, it is to be understood that the teachings are not limited to the disclosed embodiments, but, on the contrary, they are intended to cover various modifications and equivalent arrangements included within the spirit and scope of the teachings.

What is claimed is:

1. A thin film transistor array panel comprising:
a first insulation substrate;
a plurality of data wires formed on the first insulation substrate;
a data pad region formed on the first insulation substrate and having respective contact pads directly contacting respective ones of the data wires; and
an organic layer formed over the data wires and between the contact pads,
wherein a first thickness of the organic layer where the organic layer is disposed over the data wires is greater than a second thickness of the organic layer where disposed between the contact pads.

2. The thin film transistor array panel of claim 1, wherein said data wires extend in a first direction, and a top surface of the organic layer has minute slit patterns extending parallel to the first direction of extension of the data wires.

3. The thin film transistor array panel of claim 2, wherein a boundary line of each of the data wires extending from the data pad region has a zigzag shape.

4. The thin film transistor array panel of claim 3, wherein a pitch between the data wires is less than 40 μm.

5. The thin film transistor array panel of claim 4, wherein said contact pads are formed at openings defined through the organic layer and said openings each have a width that is less than 15 μm.

6. The thin film transistor array panel of claim 2, wherein a pitch between the data wires is less than 40 μm.

7. The thin film transistor array panel of claim 6, wherein said contact pads are formed at openings defined through the organic layer and said openings each have a width that is less than 15 μm.

8. The thin film transistor array panel of claim 1, wherein the data wires have line boundaries formed in a zigzag shape comprising protrusions and recesses.

9. The thin film transistor array panel of claim 1, wherein a pitch between the data wires is less than 40 μm.

10. The thin film transistor array panel of claim 9, wherein said contact pads are formed at openings defined through the organic layer and said openings each have a width that is less than 15 μm.

11. A method for manufacturing a thin film transistor array panel, comprising:
   forming a data pad region including a plurality of contact pads and data wires that overlap respective ones of the contact pads in a layout view of the data ad region; and
   forming an organic layer over the data wires and between the contact pads, such that the organic layer has a first thickness where it is disposed on the data wires and such that the organic layer has a substantially smaller second thickness where it is disposed between the contact pads.

12. The method of claim 11, wherein said forming of the organic layer includes using a photomask comprising a metal slit pattern having slits extending in a direction parallel to the data wires.

13. The method of claim 12, wherein the mask has a ratio of an opening width with respect to a dark line width of the metal slit pattern disposed on the data wires in the data pad region that is larger than a ratio of an opening width with respect to a dark line width of the metal slit pattern disposed between the data wires in the data pad region and the light exposure is exposing a negative photosensitive organic layer to a light.

14. The method of claim 12, wherein the mask has a ratio of an opening width with respect to a dark line width of the metal slit pattern disposed on the data wires in the data pad region that is smaller than a ratio of an opening width with respect to a dark line width of the metal slit pattern disposed between the data wires in the data pad region and the light exposure is exposing a positive photosensitive organic layer to a light.

15. The method of claim 12, wherein said forming of the data wires includes causing boundary lines of the data wires to have a zigzag shape.

16. A flat panel display that includes at least an array of switching elements disposed on a light-passing substrate, the flat panel display comprising:
   a plurality of data lines substantially extending in a first direction across the substrate and structured to transmit respective image data signals to pixel areas of the substrate, each of the data lines terminating in one or more contact pad regions of the substrate;
   an inorganic insulation layer disposed over the data lines;
   a plurality of contact pads contacting the plurality of data lines; and
   an organic layer disposed over the insulation layer, wherein the organic layer has openings defined therethrough at respective contact pad locations of the one or more contact pad regions, wherein said openings in the organic layer continue through the inorganic insulation layer to the data line terminations beneath for enabling the plurality of contact pads to contact the plurality of data lines through the openings, wherein the organic layer has a first, relatively large thickness in regions thereof where the organic layer overlies the data lines, and wherein the organic layer has a second, substantially smaller thickness at least in regions between said openings to the underlying data line terminations.

17. The flat panel display of claim 16 wherein the substrate further comprises a gate metal island underlying each data line termination so as to thereby elevate the data line termination relative to a top surface of surrounding material of the organic layer.

18. The flat panel display of claim 17 wherein the substrate further comprises conductive pixel-electrode material covering each of said openings in the organic layer that continue through the inorganic insulation layer to the data line terminations beneath.

19. The flat panel display of claim 16 further comprising a flexible ribbon connector making contact with the contact pad locations in at least one of the contact pad regions.

20. The flat panel display of claim 19 further comprising one or more monolithic integrated circuits that are operatively coupled to the data lines by way of said flexible ribbon connector and contact pad locations.

* * * * *